(12) United States Patent
Koshitaka et al.

(10) Patent No.: US 6,315,912 B1
(45) Date of Patent: Nov. 13, 2001

(54) PROCESS FOR FORMING A LOWER ELECTRODE OF A CYLINDRICAL CAPACITOR

(75) Inventors: Toshiaki Koshitaka, Tokyo; Tadahisa Fukushima, Hiroshima, both of (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/507,832

(22) Filed: Feb. 22, 2000

(30) Foreign Application Priority Data

Feb. 23, 1999 (JP) .................................................. 11-045128

(51) Int. Cl.[7] ..................... H01L 27/108; H01L 21/8242; H01L 27/04; H01L 21/822; H01L 21/027
(52) U.S. Cl. ............................. 216/6; 438/256; 438/253; 438/399; 438/396; 438/254; 438/397
(58) Field of Search ................................ 216/6; 438/256, 438/253, 399, 396, 254, 397

(56) References Cited

U.S. PATENT DOCUMENTS

| | | | |
|---|---|---|---|
| 5,776,660 | 7/1998 | Hackey et al. | 430/296 |
| 5,926,709 | 7/1999 | Aisou et al. | 438/253 |

FOREIGN PATENT DOCUMENTS 8-274273  10/1996  (JP) .
9-331043  12/1997  (JP) .
10-41222-a * 2/1998 (JP) .

* cited by examiner

*Primary Examiner*—Cynthia Hamilton
(74) *Attorney, Agent, or Firm*—Hutchins, Wheeler & Dittmar

(57) ABSTRACT

In a process for forming a lower electrode of a cylindrical capacitor in a semiconductor memory, a polysilicon film is formed on an insulator film to cover an inner surface of a hole formed in the insulator film. An exposed surface of the polysilicon film is treated with a reaction accelerator which reacts with a positive photoresist to lower dissolubility of the positive photoresist to a developer liquid. The positive photoresist is deposited on the whole surface to fill up the hole. As a result, the positive photoresist filled up within the hole reacts with the reaction accelerator within the hole and becomes difficult to dissolve to the developer liquid even after the positive photoresist is exposed to light. The whole of the positive photoresist is exposed to light and then developed with the developer so that the positive photoresist remains only within the hole. The polysilicon film is etched back using the remaining positive photoresist as a mask, so that the polysilicon film on an upper surface of the insulator film is removed. Furthermore, the positive photoresist remaining within the hole is removed, and the insulator film is removed so that the polysilicon film remains in the form of a cylinder.

10 Claims, 4 Drawing Sheets

PROCESS FOR FORMING A LOWER ELECTRODE OF A CYLINDRICAL CAPACITOR

BACKGROUND OF THE INVENTION

The present invention relates to a method for fabricating a semiconductor device, and more specifically to a process for forming a lower electrode of a cylindrical capacitor incorporated in a semiconductor device such as a DRAM (dynamic random access memory).

Japanese Patent Application Pre-examination Publication No. JP-A-09-331043 (an English abstract of which is available from the Japanese Patent Office and the content of the English abstract is incorporated by reference in its entirety into this application) proposes a new process for forming a lower electrode of a cylindrical capacitor.

According to this proposed process, after a hole is formed to penetrate through an insulating film having a planar upper surface, a polysilicon film (which is used for forming the lower electrode of the cylindrical capacitor) is deposited to cover the planar upper surface of the insulating film and an inner surface of the hole. Thereafter, a positive photoresist is deposited to cover the polysilicon film and to fill up the hole. Then, the positive photoresist is exposed with such an exposure energy that the positive photoresist above the planar upper surface of the insulating film is completely rendered dissoluble to a developer while the positive photoresist filled up in the hole is not rendered dissoluble to the developer because of a difference in film thickness between the positive photoresist above the planar upper surface of the insulating film and the positive photoresist filled up in the hole. Therefore, when the positive photoresist exposed as mentioned above is developed, the positive photoresist above the planar upper surface of the insulating film is removed, but the positive photoresist remains within the hole formed in the insulating film. Thereafter, the polysilicon film is etched back using the positive photoresist remaining in the hole, as a mask, with the result that the polysilicon film on the planar upper surface of the insulating film is removed, but the polysilicon film covering the inner surface of the hole remains. Succeedingly, the remaining positive photoresist is removed, and the insulating film is removed, so that the polysilicon film remains in the form of a cylinder, which constitutes the lower electrode of the cylindrical capacitor.

In the proposed process mentioned above, however, the margin of the exposure energy for causing the positive photoresist to effectively remain only within the hole is very small. Therefore, another problem has been encountered in that even if the exposure energy is strictly controlled, when a photoresist coating condition varies, no positive photoresist remains within the hole. In this case, when the polysilicon film is etched back, the polysilicon film on a bottom of the hole is removed because the polysilicon film on the bottom of the hole is not covered with the photoresist, with the result that the lower electrode of the cylindrical capacitor becomes defective. This is one of causes that lower the production yield of a semiconductor memory.

BRIEF SUMMARY OF THE INVENTION

Accordingly, it is an object of the present invention to provide a process for forming a lower electrode of a cylindrical capacitor, which has overcome the problem of the above mentioned prior art.

Another object of the present invention is to provide a process for forming a lower electrode of a cylindrical capacitor, without being influenced by variation in the photoresist coating condition and/or in the exposure energy to the positive photoresist.

The above and other objects of the present invention are achieved in accordance with the present invention by a process for forming a lower electrode of a cylindrical capacitor, comprising the steps of forming a hole in an insulator film, forming a polysilicon film on the insulator film to cover an inner surface of the hole, treating an exposed surface of the polysilicon film with a reaction accelerator which reacts with a positive photoresist to be used in a later stage to lower dissolubility of the positive photoresist to a developer liquid to be used in a further later stage, depositing the positive photoresist on the whole surface to fill up the hole, so that the positive photoresist filled up within the hole reacts with the reaction accelerator within the hole and becomes difficult to dissolve to the developer liquid even after the positive photoresist is exposed to light, exposing the whole of the positive photoresist to light, developing the positive photoresist with the developer so that the positive photoresist remains only within the hole, etching back the polysilicon film using the remaining positive photoresist as a mask to remove the polysilicon film on an upper surface of the insulator film, removing the positive photoresist remaining within the hole, and removing the insulator film so that the polysilicon film remains in the form of a cylinder.

In a preferred embodiment of the process in accordance with the present invention, the reaction accelerator includes amine.

The above and other objects, features and advantages of the present invention will be apparent from the following description of preferred embodiments of the invention with reference to the accompanying drawings.

DETAILED DESCRIPTION OF THE INVENTION

Now, a fundamental feature of the process in accordance with the present invention for forming a lower electrode of a cylindrical capacitor will be described with reference to FIGS. 1A to 1E.

Figure 1A:
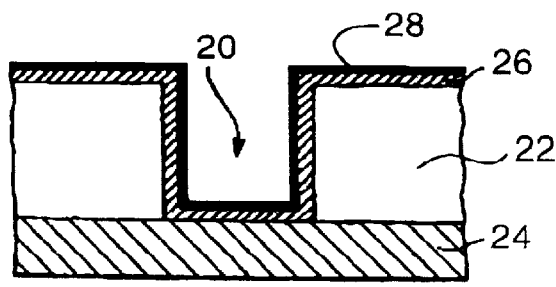
FIGS. 1A to 1E are diagrammatic sectional views of a cylindrical capacitor lower electrode, for illustrating a fundamental feature of the process in accordance with the present invention for forming a lower electrode of a cylindrical capacitor.

First, as shown in FIG. 1A, a hole 20 is formed to penetrate through a planarized insulating film 22 formed on a semiconductor substrate 24 so as to reach the semiconductor substrate 24. A polysilicon film 26 (which is used for forming the lower electrode of the cylindrical capacitor) is deposited to cover a planar upper surface of the insulating film 22 and an inner surface of the hole 20. Thereafter, the semiconductor substrate 24 (particularly, an overall exposed surface of the deposited polysilicon film 26 including an exposed surface of the polysilicon film deposited on the inner surface of the hole 20) is treated with a reaction accelerator 28, which reacts with a positive photoresist to be used in a next stage to lower a dissolubility of the positive photoresist to a developer liquid to be used in a later stage. As a result, the exposed surface of the polysilicon film 26 is coated with a thin film of reaction accelerator 28, which is shown in an exaggerated condition in FIG. 1A.

Figure 1B:
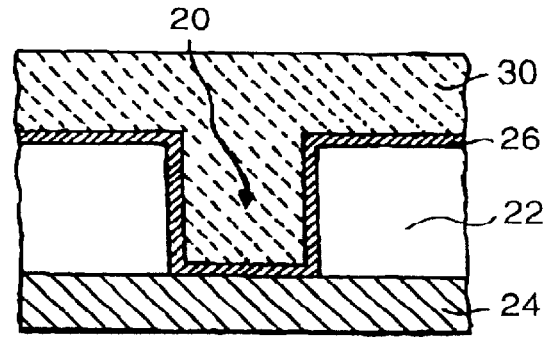

Then, a positive photoresist is spin-coated on the semiconductor substrate 24 so that a positive photoresist layer 30 is formed to cover the whole surface of the semiconductor substrate 24 and to fill up the hole 20, as shown in FIG. 1B. The deposited positive photoresist 30 reacts with the reaction accelerator 28. Here, since the inner surface of the hole 20 has a large surface area, namely, since the hole 20 has a side surface coated with the reaction accelerator 28, the amount of the reaction accelerator 28 per unit area in plan view within the hole 20 is larger than the amount of the reaction accelerator 28 per unit area in plan view on the upper surface of the polysilicon film 26, the positive photoresist 30 within the hole 20 sufficiently reacts with the reaction accelerator 28, with the result that the positive photoresist 30 within the hole 20 becomes difficult to dissolve to the developer liquid used in a later stage. On the other hand, since the positive photoresist 30 on the upper surface of the polysilicon film 26 does not sufficiently react with the reaction accelerator 28, the positive photoresist 30 on the upper surface of the polysilicon film 26 is maintained in a condition capable of becoming dissoluble to the developer liquid after the positive photoresist is exposed to light.

Figure 1C:
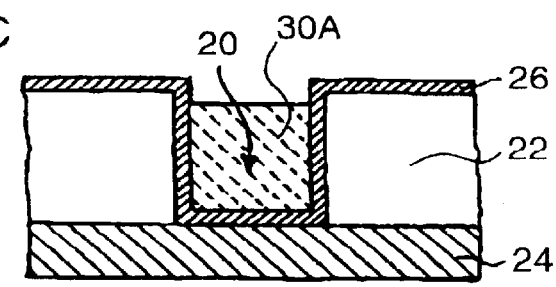

Thereafter, the whole surface is exposed to light, and the positive photoresist 30 is developed with the developer liquid. In this development process, the positive photoresist 30 within the hole 20 which reacted with the reaction accelerator 28 and therefore which has already become difficult to dissolve to the developer liquid, is not decomposed by the exposure light and therefore is not dissolved by the developer liquid. As a result, the positive photoresist remains only within the hole 20, as shown by the reference number 30A in FIG. 1C. On the other hand, the positive photoresist 30 on the upper surface of the polysilicon film 26 is decomposed by the exposure light and therefore is dissolved and removed by the developer liquid, as shown in FIG. 1C.

Figure 1D:
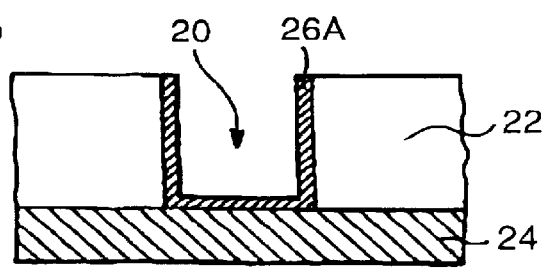
Figure 1E:
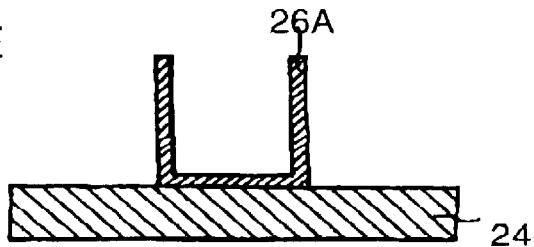

Then, the polysilicon film 26 is etched back using the remaining positive photoresist 30A as a mask, so that the polysilicon film 26 remains only within the hole 20, as shown by the reference number 26A in FIG. 1D. Thereafter, by removing the insulating film 22, a cylindrical lower electrode for the cylindrical capacitor is constituted by the remaining polysilicon film 26A, as shown in FIG. 1E.

As mentioned above, the process in accordance with the present invention for forming the lower electrode of the cylindrical capacitor is characterized in that before the positive photoresist is deposited, the semiconductor substrate is treated with the reaction accelerator that reacts with a positive photoresist used in a later stage to lower a dissolubility of the positive photoresist to a developer liquid used in a further later stage. Since the amount of the reaction accelerator per unit area in plan view within the hole is larger than the amount of the reaction accelerator per unit area in plan view on the upper surface of the polysilicon film, the positive photoresist within the hole becomes more difficult to dissolve to the developer liquid, than the positive photoresist on the upper surface of the polysilicon film. As a result, after the whole surface exposure and the development, the positive photoresist remains only within the hole, and on the other hand, the positive photoresist on the upper surface of the polysilicon film is dissolved and removed by the developer liquid.

Here, the positive photoresist is generally called a novolak resin type of photoresist, and is composed of a cresol novolak resin and a photosensitive agent having the effect of suppressing the dissolution of the novolak resin. In the following, the structure of two photosensitive agents is exemplified.

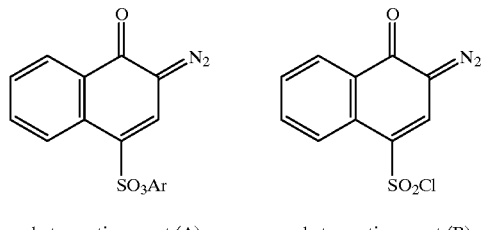

photosenstive agent (A)          photosenstive agent (B)

The photosensitive agent (A) is a normal photosensitive agent, but there inevitably co-exists another photosensitive agent (B) having a chlorine ion substituted for an argon ion in the photosensitive agent (A). As shown in the following reaction diagram, the photosensitive agent (B) reacts with moisture (C) in atmosphere or on the substrate to generate a reaction product (D) and a hydrochloric acid (E). Furthermore, also as shown in the following reaction diagram, the hydrochloric acid (E) thus generated reacts with the normal photosensitive agent (A) to generate another reaction product (F) that is not sensitive to light and therefore has no nature of decomposing in response to light. This reaction product (F) causes an azo-coupling reaction with a benzene ring of the cresol novolak resin, so that the dissolution of the photoresist drops. Incidentally, the reaction product (D) is sensitive to light and therefore has the nature of decomposing in response to light, and therefore, is dissolved by the developer liquid after the exposure. However, the reaction product (D) does not influence the above mentioned action of the reaction product (F).

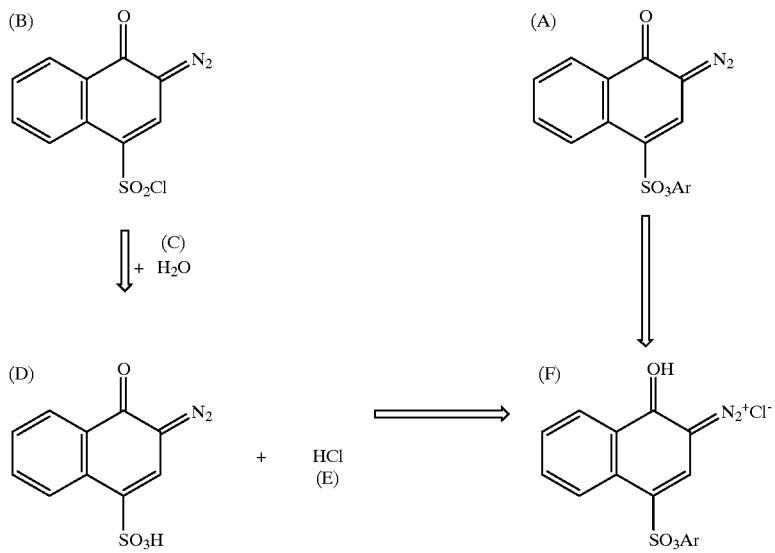

As mentioned above, the hydrochloric acid (E) is generated when the photosensitive agent (B) reacts with water (C). However, when an amine exists, the reaction of the photosensitive agent (B) with the water (C) is accelerated, so that a large amount of hydrochloric acid is generated. Therefore, when the amine exists richly, the dissolution of the photoresist remarkably drops.

Here, hexamethyl disilazane (HMDS) or ammonia can be exemplified as the amine used as the reaction accelerator. A nitrogen atom in the amine reacts with a hydrogen atom of the moisture in atmosphere or on the substrate, to generate a hydroxyl group, which then reacts with the photosensitive agent (B) to generate the hydrochloric acid (E). The hydrochloric acid (E) further reacts with the photosensitive agent (A) to generate the reaction product (F) that is not sensitive to light and therefore has no nature of decomposing in response to light.

Incidentally, when the hexamethyl disilazane (HMDS) is used as the reaction accelerator, the hexamethyl disilazane (HMDS) is heated to 90 degrees Celsius to 140 degrees Celsius so that the hexamethyl disilazane is vaporized, and the vaporized hexamethyl disilazane is blown to a wafer (namely, the polysilicon film formed on the semiconductor substrate). If the ammonia is used as the reaction accelerator, an ammonia water is used.

Accordingly, if the surface of the semiconductor substrate is treated with the reaction accelerator typified by the amine, since the amount of the reaction accelerator per unit area in plan view within the hole is larger than the amount of the reaction accelerator per unit area in plan view on the upper surface of the polysilicon film, when the positive photoresist is deposited, exposed and developed, it is possible to cause the positive photoresist to remain only within the hole, without being influenced with variation in the exposure energy and/or with variation in the deposition condition of the positive photoresist. In this connection, in order to elevate the above mentioned effect, it is possible to intentionally increase the concentration of the photosensitive agent (B) in the photoresist.

Now, the process in accordance with the present invention for forming a lower electrode of a cylindrical capacitor in the semiconductor memory will be described with reference to FIGS. 2A to 2I which are diagrammatic sectional views of a semiconductor memory, for illustrating the process in accordance with the present invention.

Figure 2A:
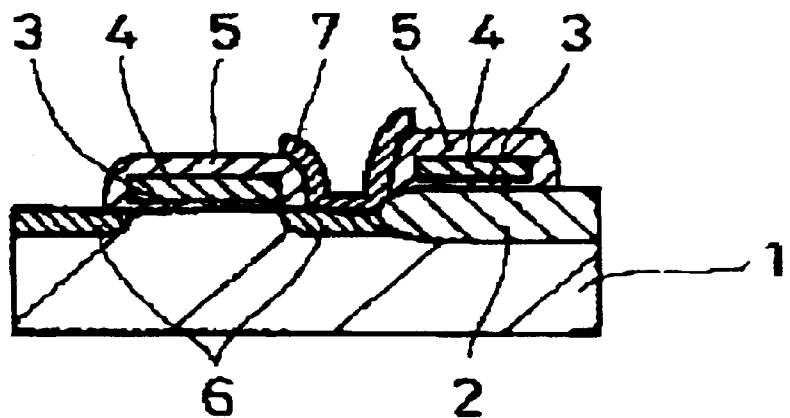
FIGS. 2A to 2I are diagrammatic sectional views of a semiconductor memory, for illustrating the process in accordance with the present invention for forming a lower electrode of a cylindrical capacitor in the semiconductor memory.

FIG. 2A shows a condition in which a MOS transistor is formed on a semiconductor substrate 1 in accordance with a conventional process known to persons skilled in the art. Namely, a device isolation film 2 is formed on a principal surface of the semiconductor substrate 1 by a conventional process such a LOCOS (local oxidation of silicon) process. As a gate oxide film, a thin silicon oxide film 3 is formed on the principal surface of the semiconductor substrate 1 and on the device isolation film 2. A polysilicon film is deposited on the thin silicon oxide film 3 and then patterned by a known photolithography and etching to form a gate electrode 4. Furthermore, a silicon oxide film 5 is deposited to completely cover the gate electrode 4 by for example a CVD (chemical vapor deposition) process in order to insulate the gate electrode 4 from other conductors, and then, impurity ions are ion-implanted to the principal surface of the semiconductor substrate 1 by an ion implantation using the gate electrode 3 as a mask, so that impurity diffused regions 6 are formed on opposite sides of the gate electrode 3 as a pair of source/drain regions. Thereafter, the oxide film on one of the pair of impurity diffused regions 6 is selectively removed, and a polysilicon film is deposited on the whole surface. Furthermore, a photoresist is spin-coated on the whole surface and patterned by a conventional lithography. The polysilicon film is etched using the patterned photoresist as a mask, so that a patterned polysilicon film 7 is formed in contact with the one of the pair of impurity diffused regions 6.

Figure 2B:
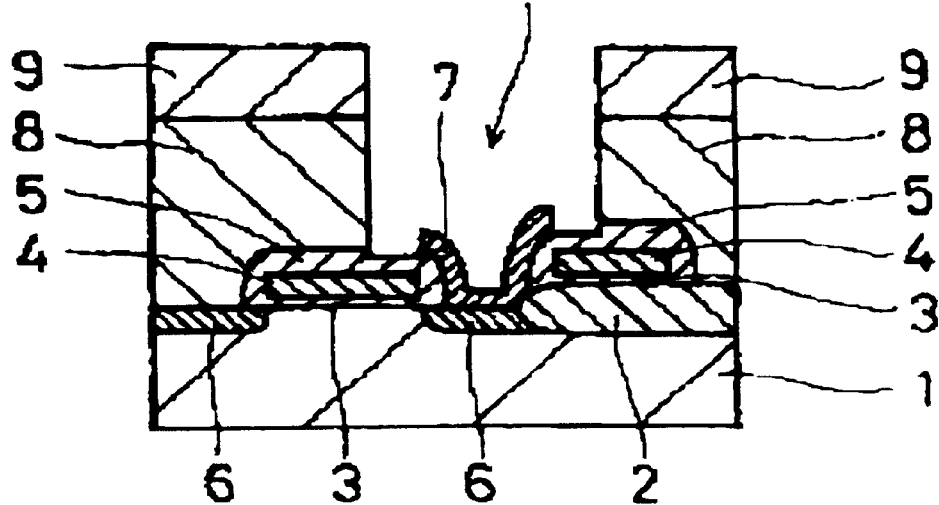

Then, as shown in FIG. 2B, an insulating film is deposited on the whole surface and planarized to form a planarized layer 8. A photoresist 9 is spin-coated on the whole surface of the planarized layer 8, and the photoresist 9 is patterned by selectively removing the photoresist 9 from a region where a lower electrode of a cylindrical capacitor is to be formed. The planarized layer 8 is dry-etched using the patterned photoresist 9 as a mask, so that a hole 10 is formed to reach the patterned polysilicon film 7.

Figure 2C:
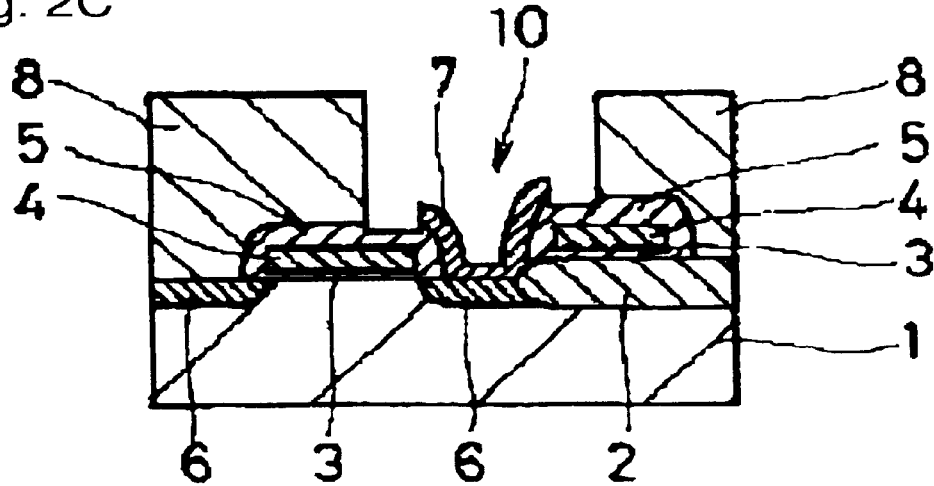
Figure 2D:
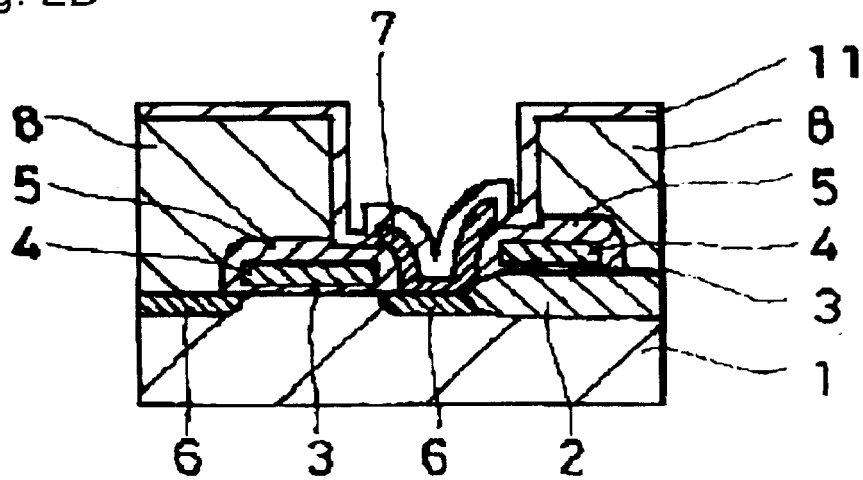

Thereafter, the patterned photoresist 9 is removed as shown in FIG. 2C. Furthermore, as shown in FIG. 2D, a polysilicon film 11 is deposited on the whole surface by for example a low pressure CVD process, to cover an upper surface of the planarized layer 8 and an inner surface of the hole 10, and then, the substrate 1 is treated with the reaction accelerator such as hexamethyl disilazane (not shown in FIG. 2D). As a result, a thin film of reaction accelerator is coated on the whole exposed surface of the polysilicon film 11.

Figure 2E:
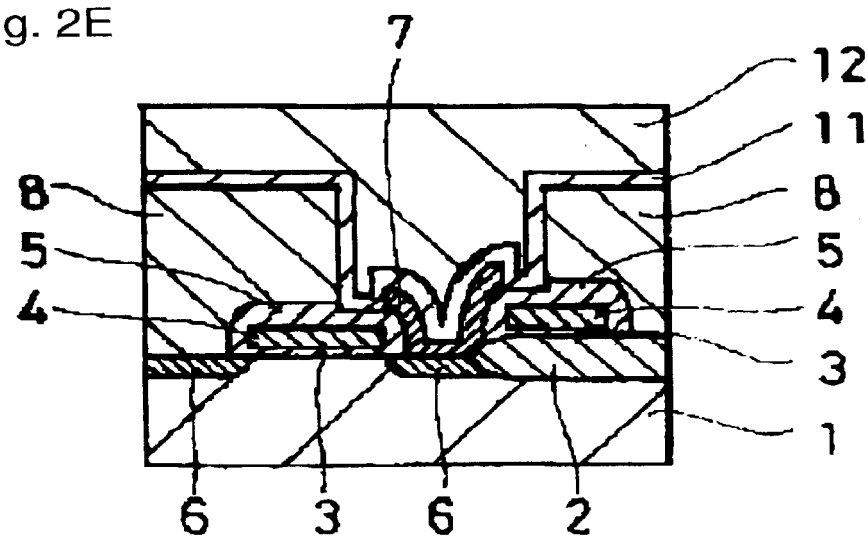

Then, a photoresist 12 is spin-coated on the whole surface of the polysilicon film 11 as shown in FIG. 2E. The photoresist 12 reacts with the reaction accelerator coated on the whole exposed surface of the polysilicon film 11, so that the photoresist 12 within the hole 10 loses the photosensitivity and becomes difficult to dissolve to a developer liquid even if it is developed with the developer liquid after exposure.

Figure 2F:
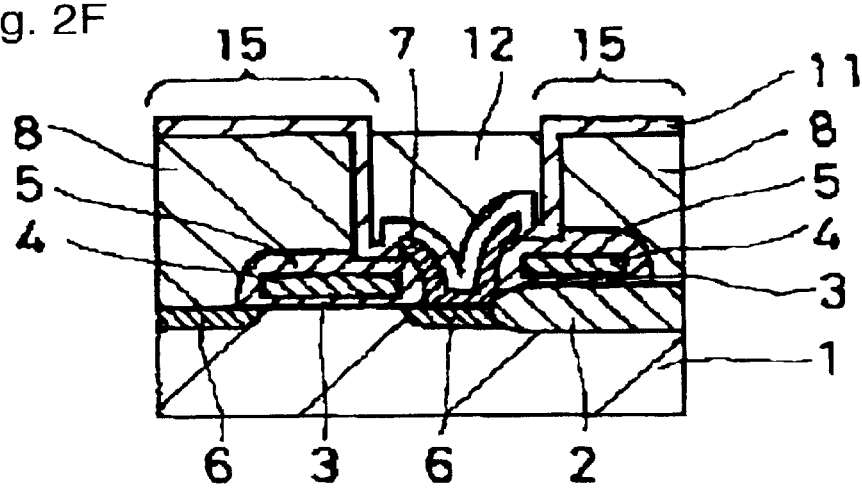
Figure 2G:
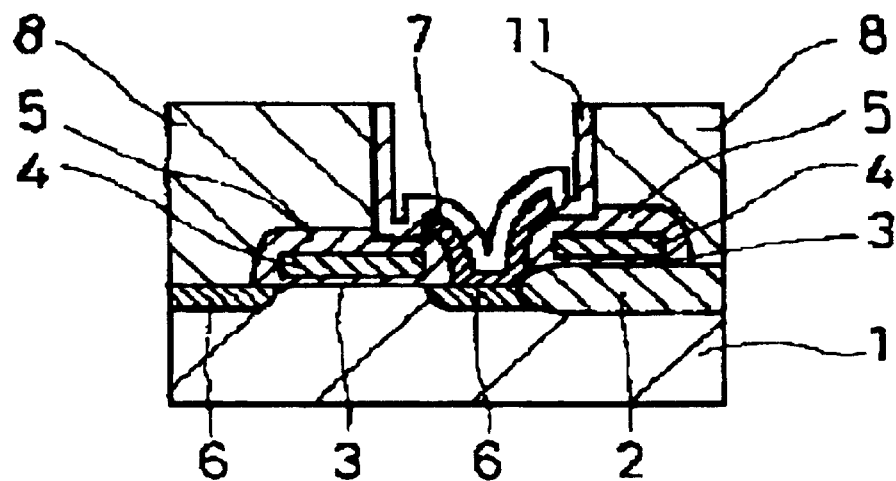

Thereafter, the whole of the photoresist 12 is exposed to light and developed with a developer liquid. As a result, the photoresist 12 on a planarized surface area 15 of the polysilicon film 11 is completed removed, and the photoresist 12 remains only within the hole 10, as shown in FIG. 2F. Then, the whole surface is etched back by a dry etching using the remaining photoresist 12 as a mask, with the result that the polysilicon film 11 on the planarized surface area 15 is removed as shown in FIG. 2G. Succeedingly, the remaining photoresist 12 within the hole 10 is removed by an oxygen ashing, also as shown in FIG. 2G.

Figure 2H:
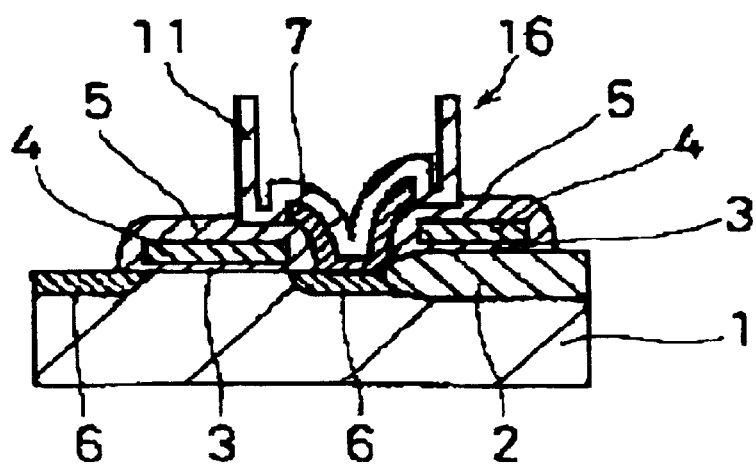
Figure 2I:
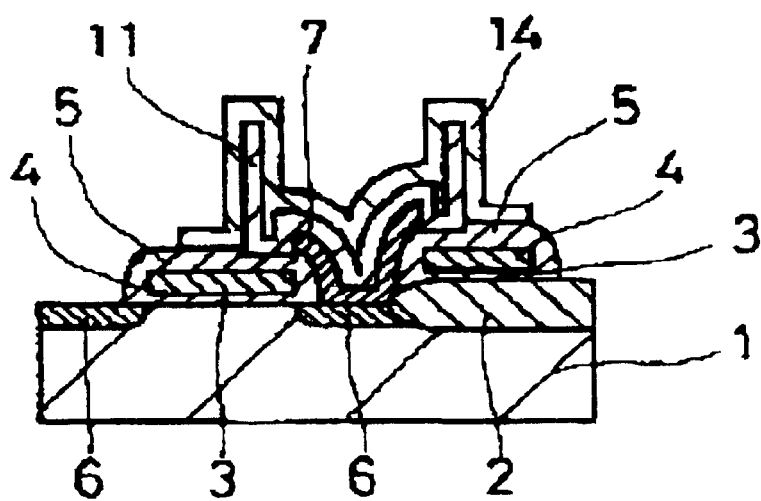

Furthermore, the planarized layer 8 is etch-removed as shown in FIG. 2H. Thus, a cylindrical lower electrode 16 is formed.

Thereafter, an extremely thin dielectric film (not shown in FIG. 2I) is formed on the whole exposed surface of the cylindrical lower electrode 16, and then, a polysilicon film 14 is deposited on the extremely thin dielectric film and patterned as an upper electrode of the cylindrical capacitor.

Thus, the cylindrical capacitor formed of the cylindrical lower electrode 16 and the upper electrode 14 separated by the not-shown extremely thin dielectric film formed on the whole surface of the cylindrical lower electrode 16, is completed.

The invention has thus been shown and described with reference to the specific embodiments. However, it should be noted that the present invention is in no way limited to the details of the illustrated structures but changes and modifications may be made within the scope of the appended claims.

What is claimed is:

1. A process for forming a lower electrode of a cylindrical capacitor, comprising the steps of forming a hole in an insulator film, forming a polysilicon film on said insulator film to cover an inner surface of said hole, treating an exposed surface of said polysilicon film with a reaction accelerator which reacts with a positive photoresist to be used in a later stage to lower dissolubility of said positive photoresist to a developer liquid to be used in a further later stage, depositing said positive photoresist on the whole surface to fill up said hole, so that said positive photoresist filled up within said hole reacts with said reaction accelerator within said hole and becomes difficult to dissolve to said developer liquid even after said positive photoresist is exposed to light, exposing the whole of said positive photoresist to light, developing said positive photoresist with said developer so that said positive photoresist remains only within said hole, etching back said polysilicon film using the remaining positive photoresist as a mask to remove said polysilicon film on an upper surface of said insulator film, removing said positive photoresist remaining within said hole, and removing said insulator film so that said polysilicon film remains in the form of a cylinder.

2. A process claimed in claim 1 wherein said reaction accelerator includes amine.

3. A process claimed in claim 1 wherein said reaction accelerator includes a material selected from the group consisting of hexamethyl disilazane and ammonia.

4. A process claimed in claim 1 wherein said reaction accelerator includes hexamethyl disilazane, and the treatment of said exposed surface of said polysilicon film with said reaction accelerator is carried out by vaporizing said hexamethyl disilazane and by blowing the vaporized hexamethyl disilazane to said exposed surface of said polysilicon film.

5. A process claimed in claim 4 wherein the vaporization of said hexamethyl disilazane is carried out by heating said hexamethyl disilazane to a temperature in the range of 90 degrees Celsius to 140 degrees Celsius.

6. A process for forming a lower electrode of a cylindrical capacitor, comprising the steps of forming a hole in an insulator film, forming a polysilicon film on said insulator film to cover an inner surface of said hole, coating an exposed surface of said polysilicon film with a thin film including a reaction accelerator which reacts with a positive photoresist to be used in a later stage to lower dissolubility of said positive photoresist to a developer liquid to be used in a further later stage, depositing said positive photoresist on the whole surface to fill up said hole, so that said positive photoresist filled up within said hole reacts with said reaction accelerator within said hole and becomes difficult to dissolve to said developer liquid even after said positive photoresist is exposed to light, exposing the whole of said positive photoresist to light, developing said positive photoresist with said developer so that said positive photoresist remains only within said hole, etching back said polysilicon film using the remaining positive photoresist as a mask to remove said polysilicon film on an upper surface of said insulator film, removing said positive photoresist remaining within said hole, and removing said insulator film so that said polysilicon film remains in the form of a cylinder.

7. A process claimed in claim 6 wherein said reaction accelerator includes amine.

8. A process claimed in claim 6 wherein said reaction accelerator includes a material selected from the group consisting of hexamethyl disilazane and ammonia.

9. A process claimed in claim 6 wherein said reaction accelerator includes hexamethyl disilazane, and the coating of said thin film including said reaction accelerator is carried out by vaporizing said hexamethyl disilazane and by blowing the vaporized hexamethyl disilazane to said exposed surface of said polysilicon film.

10. A process claimed in claim 9 wherein the vaporization of said hexamethyl disilazane is carried out by heating said hexamethyl disilazane to a temperature in the range of 90 degrees Celsius to 140 degrees Celsius.

* * * * *